United States Patent

[11] 3,594,657

[72] Inventor Edward J. Cook
Hamilton, Mass.
[21] Appl. No. 815,465
[22] Filed Apr. 11, 1969
[45] Patented July 20, 1971
[73] Assignee Varian Associates
Palo Alto, Calif.

[54] HIGH FREQUENCY COAXIAL LINE CIRCUIT FOR AN AVALANCHE DIODE NOISE GENERATOR
8 Claims, 7 Drawing Figs.

[52] U.S. Cl. .......... 331/78, 331/101, 331/107 R, 331/177 V
[51] Int. Cl. .......... H03b 7/14, H03b 29/00
[50] Field of Search .......... 331/78, 101, 107, 177 V

[56] References Cited

UNITED STATES PATENTS 3,443,244 5/1969 Cook .......... 331/107 X

OTHER REFERENCES

Haitz, JOURNAL OF APPLIED PHYSICS Vol. 38, June 1967, pp. 2935—2946. (331—78)

Schaffner, ELECTRONIC DESIGN, Vol. 21, Oct. 11, 1967, pp. 78—82. (331-177V)

*Primary Examiner*—Roy Lake
*Assistant Examiner*—Siegfried H. Grimm
*Attorneys*—Stanley Z. Cole and Robert W. Dilts

ABSTRACT: The coaxial line circuit for an avalanche diode noise generator is disclosed. The coaxial line circuit includes a short at one end thereof with the avalanche diode connected in series with the inner conductor at the shorted end of the coaxial line. The short preferably includes a block of thermally conductive material closing off the end of the coaxial line with one terminal of the diode being connected to the block for heat sinking the diode. In addition, the shorting block includes a portion concentric to and axially coextensive with the end portion of the outer conductor of the transmission line to form a relatively high capacitance between the outer conductor and the shorting block. This capacitance stores the energy for the relaxation oscillator mode of the avalanche diode which is preferably operated as a noise generator. In another embodiment, a wave-reflective member is placed within the coaxial line a distance from the short-circuited end thereof to produce a subharmonic cavity for increasing the power density of the noise spectrum output at higher harmonics of the cavity. In another embodiment, a varactor diode is placed in the coaxial transmission line at a point of maximum electric field of the output mode for tuning the output frequency of the noise.

INVENTOR.
EDWARD J. COOK

BY

Robert W. Dilts

ATTORNEY

HIGH FREQUENCY COAXIAL LINE CIRCUIT FOR AN AVALANCHE DIODE NOISE GENERATOR

DESCRIPTION OF THE PRIOR ART

Heretofore, coaxial line circuits for avalanche diodes operating in the relaxation oscillator mode have been disclosed, see copending U.S. application, Ser. No. 694,644 filed Dec. 29, 1967, now abandoned and assigned to the same assignee as the present invention. In this prior art device, a section of coaxial line was shorted at one end with the avalanche diode connected in series with the center conductor at the shorted end of the coaxial line. The capacitance for the relaxation oscillator was derived from the stray capacitance of the avalanche diode. The other end of the coaxial line was open-circuited to provide a quarter-wave resonator. Output energy was extracted from the resonator via a coupling probe to a coaxial line. The resonator had a relatively high Q and the output energy was peaked at the resonant frequency of the resonator. A relatively high Q cavity produced an output signal which was found to be coherent, as opposed to producing a noise output with a relatively low Q resonator. Although the stray capacitance of the diode may be employed as the charge storage element for the relaxation mode of oscillation, it is desired for higher power outputs, that a separate capacitive element be provided having substantial capacitance, as of 10 picofarads, for storing substantial charge which is to be repetitively dumped through the diode. In addition, it is desired to provide improved heat sinking for the diode such that its capacity for operating at higher power levels is improved.

SUMMARY OF THE PRESENT INVENTION

The principal object of the present invention is the provision of an improved coaxial line circuit for avalanche diodes operating in the relaxation mode.

One feature of the present invention is the provision of a section of coaxial line which is short circuited at one end by means of a conductive structure substantially closing off the end of the transmission line, such conductive structure including a portion concentric to and axially coextensive with the end portion of the outer conductor of the transmission line to form a capacitor at the shorted end of the line, whereby the output power level of the device may be increased.

Another feature of the present invention is the same as the preceding feature wherein the shorting means comprises a block of electrically and thermally conductive material placed in heat-exchanging relation with the diode for heat sinking the diode in use.

Another feature of the present invention is the same as any one or more of the preceding features wherein the coaxial line includes a wave-reflective member therein spaced from shorting means to define a coaxial resonator structure having a fundamental resonant frequency at a subharmonic of the operating frequency of the avalanche diode in the resonator, whereby harmonic mixing is obtained to produce spikes of noise energy at a relatively high spectral density at the higher harmonic frequencies of the resonant coaxial line.

Another feature of the present invention is the same as any one or more of the preceding features including the provision of a varactor diode connected between the inner and outer conductors of the coaxial line for tuning the operating frequency of the device.

Another feature of the present invention is the same as any one or more of the preceding features wherein the shorting means is supported coaxially within a conductive housing structure via the intermediary of a thermally conductive tubular insulator.

Other features and advantages of the present invention will become apparent upon a perusal of the following specification taken in connection with the accompanying drawings wherein:

DESCRIPTION OF THE PREFERRED EMBODIMENTS

Figures 1, 2, 3A, 3B, 4, 5, 6:
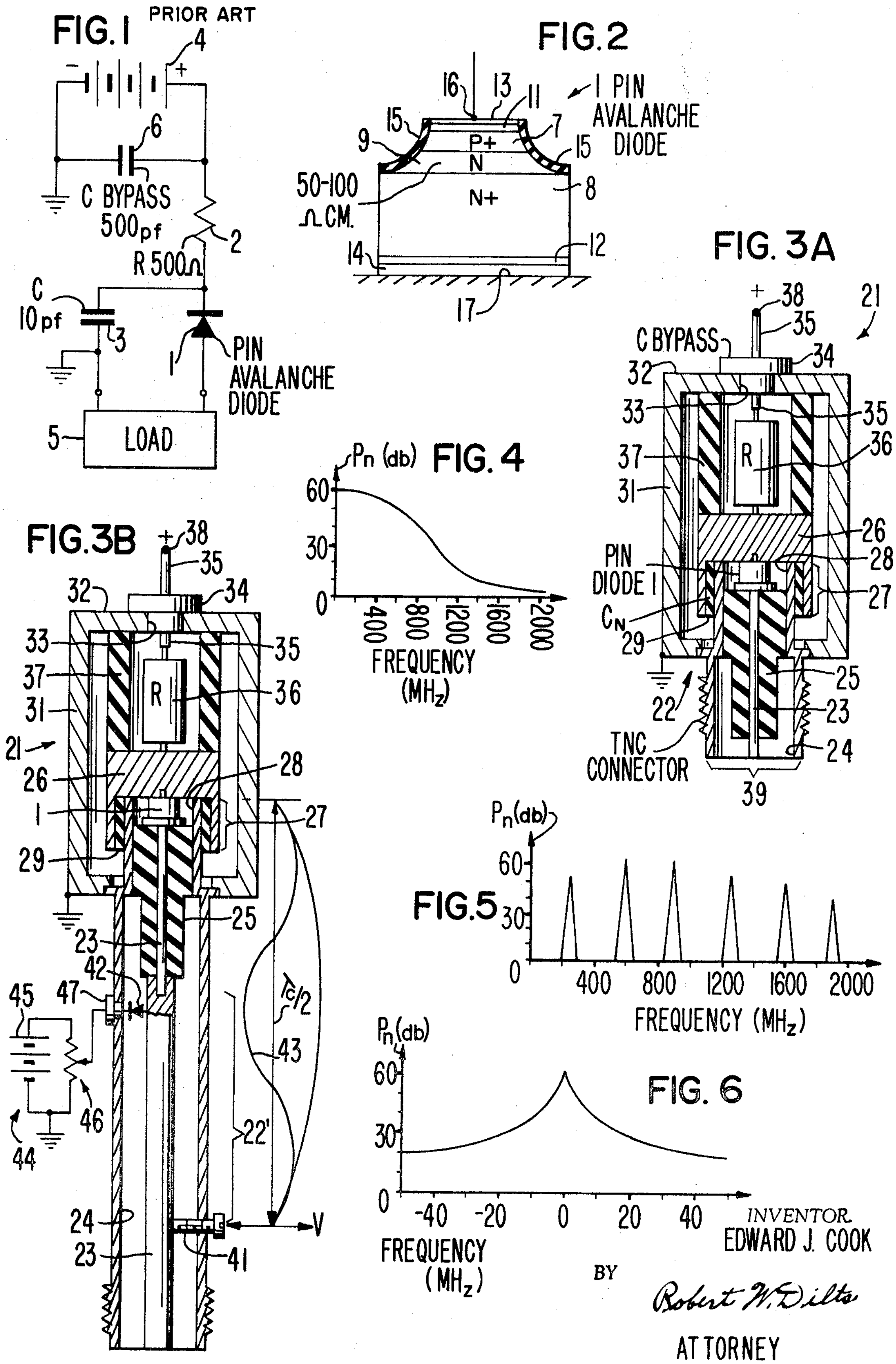
FIG. 1 is a schematic line diagram, partly in block diagram form, depicting the prior art avalanche diode relaxation oscillator circuit.
FIG. 2 is a schematic line diagram of a mesa-type PIN avalanche diode incorporating features of the present invention.
FIGS. 3A and 3B are longitudinal sectional views of alternative coaxial line circuits incorporating features of the present invention.
FIG. 4 is a plot of noise power in db. versus frequency in megahertz depicting the noise output spectrum of one embodiment of the circuit of FIG. 3A.
FIG. 5 is a plot of noise power $P_n$ in db. versus frequency in megahertz depicting the power output spectrum for the structure of FIG. 3B.
FIG. 6 is a plot of noise power in db. versus frequency deviation in megahertz for the third harmonic noise spike of the diagram of FIG. 5.

Referring now to FIG. 1, there is shown a relaxation oscillator circuit incorporating a PIN diode 1 of the type as shown in FIG. 2. The relaxation oscillator circuit includes a resistor 2 and a capacitor 3 connected in series with a source of positive potential 4, as of 400 volts. The PIN avalanche diode 1 is connected in parallel with capacitor 3. The avalanche diode 1 is connected in the reverse direction with regard to the source 4 of the bias potential. A load impedance 5, as of 50 ohms, is connected in series with the diode 1 to ground. A bypass capacitor 6 is connected across the terminals of the source 4 for bypassing RF currents around the source. A typical value for the bypass capacitor $C_{bypass}$ is 500 picofarads. A typical value for the resistor 2 is 500 ohms and a typical value for the capacitor 3 is 10 picofarads.

Referring now to FIG. 2, the PIN avalanche diode is shown in greater detail. The diode 1 is of the mesa type and is made of silicon semiconductive material. More particularly, the diode 1 includes a $p^+$ doped layer 7, as of 10 microns thick, and an $n^+$ doped layer 8, as of 0.007 to 0.015 inch thick, such $n^+$ layer having a resistivity of approximately 0.007 ohm-centimeter. An intrinsic $n$ region 9 is disposed intermediate the $p^+$ layer 7 and the $n^+$ layer 8. The intrinsic $n$ region 9 has a thickness in excess of 5 microns, as of 11 microns, and a restivity greater than 50 ohm-centimeters, as of 50—100 ohm-centimeters.

A pair of nickel electrodes 11 and 12 are deposited upon opposite sides of the diode structure for making ohmic contacts to the $p^+$ layer 7 and the $n^+$ layer 8, respectively. Layers of gold 13 and 14 are deposited over the nickel layers 11 and 12, respectively, for facilitating electrical contact to the nickel electrodes 11 and 12. The diode 1 is formed in the conventional mesa configuration and the top exposed side edges of the mesa are passivated by means of an insulative coating 15 formed to a thickness, as of 800 A. An electrical lead 16 is bonded to contact 13 and contact 14 is soldered to a diode support pedestal 17 within the diode package, not shown.

As used herein, the term "avalanche diode" is defined to mean a diode having a static current versus voltage characteristic of the typical diode type except that when a reverse bias of a relatively large value, as of greater than 100 volts, is applied to the diode the diode breaks down into a negative resistance characteristic having an avalanche type breakdown associated with a bulk effect due to the intrinsic layer 9. This negative resistance appears to be due to the space charge of the generated carriers in the distributed avalanche. The time required for the avalanche to turn on and off has been observed to be circuit limited at about 150 to 200 picoseconds.

In the relaxation oscillator circuit of FIG. 1, charging current flows from the source 4 through the series resistance 2 to charge the capacitor 3. When the reverse voltage developed across the capacitor 3 reaches the breakdown voltage as of minus 130 volts, for the diode 1, the diode avalanches into the negative resistance region and discharges the charge on the capacitor 3 through the load resistance 5. The charging voltage and discharging current characteristics are typical capacitor charging and discharging characteristics. The repetition frequency of the relaxation oscillator is determined by the series resistance 2, the capacitance of capacitor 3, and the voltage of source 4. The load impedance 5 determines the shape of the circuit ring when the diode 1 turns on.

Referring now to FIG. 3A, there is shown a coaxial line circuit 21 incorporating features of the present invention. The coaxial line circuit 21 includes a section of coaxial line 22 having an inner conductor 23 and an outer conductor 24. The inner conductor 23 is supported from the outer conductor 24 via the intermediary of an insulative sleeve 25, as of Teflon. A conductive block 26, as of copper, closes off the inner end of the coaxial line 22. The block 26 includes a cylindrical portion 27 which is concentric to and axially coextensive with a portion 28 of the outer conductor 24 of the coaxial line 22. An insulative coating 29 on the outer surface of the outer conductor 28 prevents short circuiting of the capacitor structure formed by the axially coextensive cylindrical portions 27 and 28. The insulative coating 29 may comprise, for example, an anodized layer on the outer surface of the outer conductor 24 of the coaxial line 22.

The PIN avalanche diode 1 is connected at the shorted end of the coaxial line 22 between the conductive block 26 and the inner end of the center conductor 23 such that the diode 1 is placed in series with the center conductor 23 of the coaxial transmission line 22. One terminal of the diode 1 is preferably connected directly to the conductive block 23 to place the diode in good thermal-exchanging relation with the copper block 26 such that the block 26 forms a heat sink for the diode 1.

A hollow cylindrical conductive housing 31 coaxially surrounds the shorted end of the transmission line 22 and is fixedly secured to the outer conductor 24. The housing 31 is closed at its other end via wall 32. Wall 32 is centrally apertured at 33 to receive a bypass capacitor structure 34. The bypass capacitor 34 includes a centrally disposed lead 35 which is connected in series with a block 26 via resistor 36. Lead 35 and resistor 36 are coaxially disposed of a hollow cylindrical thermally conductive insulative member 37, as of beryllia. The cylindrical insulator 37 is affixed to the end wall 32 of the housing 31 and extends coaxially of the housing with the conductive block 26 affixed to the inner end thereof such that the cylindrical insulator supports the conductive block from the housing.

The operating voltage from source 4 is applied to the lead 35 at terminal 38. Output energy is extracted from the coaxial circuit via the open end 39 of the coaxial line 22. If the output is taken from output 39 and fed to a suitable load the circuit of 21 is operable as a noise generator producing a relatively broad spectrum of noise energy as shown in FIG. 4. The power output versus frequency characteristic of FIG. 4 was obtained with the circuit of FIG. 3A utilizing the values of resistance and capacitance shown in FIG. 1.

The advantage of the noise generator circuit 21 as compared with the prior art, is that the capacitor structure $C_n$ has much higher capacitance than the previously employed stray capacitance of the diode 1. Thus, more energy is stored in the capacitor and more energy is dumped from the capacitor through the diode, when it avalanches, into the load. Thus, the power output is increased over the prior art. Moreover, the relatively large copper block 26, placed in good thermal-exchanging relation with the diode, serves as a good heat sink for the diode permitting the diode to handle the higher power levels. Moreover, the heat is removed from the heat-sinking block 26 via the thermally conductive beryllia support 37.

In order to obtain the widest possible noise bandwidth, the rise time of the current pulse resulting from the discharge of capacitor $C_n$ must be made as fast as possible, which means that the inductance of the discharge circuit has to be minimized. The construction of the capacitors $C_n$, namely, the concentric arrangement of cylinders substantially at the shorting block 26, results in negligible inductance at frequencies up through S-band. The actual magnitude of the capacitor is limited by the peak discharge current capability of the avalanche diode 1. For practical diodes on the order of 100 to 200 volts breakdown, this capacitance is usually in the neighborhood of 10 to 20 picofarads.

Referring now to FIG. 3B, an alternative embodiment of the noise generator circuit 21 is depicted. More particularly, the structure is essentially the same as that of FIG. 3A with the modification that the coaxial transmission line 22 is extended at 22′ and a wave-reflective member 41, such as a conductive post, is positioned at a distance $\approx\lambda c/2$ along the transmission line 22 from the shorting block 26, where $\lambda_c$ is an electrical wavelength at a subharmonic of the desired noise output frequency from the circuit 21. The reflective member 41 interconnects the inner and outer conductors 23 and 24, respectively, to form a coaxial resonator structure between the reflector 41 and the shorting block 26. In the case of the example as shown, the resultant coaxial resonator was critically coupled and had a loaded Q of approximately 50.

The noise output energy from such a coaxial resonator circuit is shown in FIG. 5, where the spikes of output noise energy appear at multiples of the fundamental frequency of the cavity. Typically, the second or third harmonic has the greatest amplitude. In a typical example, the cavity had a fundamental frequency of 280 megahertz and the third output harmonic noise spike occurred near 900 megahertz. The noise spectrum of the third harmonic output spike is shown in FIG. 6 wherein it is seen that the noise output power is concentrated within a 100-megahertz bandwidth. The peak noise power density was approximately 0.02 milliwatt per megahertz.

Provision of the coaxial resonator structure appreciably increases the power density near the harmonics of the resonator. In particular, the noise power density in the 900-megahertz line is more than 30 db. greater than the power density present in the untuned noise generator. The reason for this increased power density is that the avalanche diode, which is undergoing oscillation, has a large nonlinear reactive component in the microwave frequency range. It is possible to use this reactive component as a multiplier to produce frequency conversion at reasonable efficiency.

The harmonic noise output peaks can be tuned in frequency by the provision of a varactor diode 42 positioned at a point of maximum electric field for the desired harmonic as indicated by curve 43. The diode is preferably connected between the center conductor and ground through a bias network 44 consisting of a battery 45 and a potentiometer 46 with the reverse bias voltage derived from the potentiometer pickoff being applied to the diode 42. A bypass capacitor 47 permits the lead from the pickoff to be fed through the outer conductor 24 of the coaxial line 22 for connection to the diode 42. By changing the bias voltage applied to the varactor, the noise harmonic output of interest can be tuned by, for example, 10 percent.

Although the wave-reflective member 41 for defining the coaxial resonator has been depicted as a conductive short this is not a requirement. The reflective element may be a capacitive post or an inductive post and need not make a conductive connection between the inner and outer conductors 23 and 24, respectively, providing the load furnishes a DC return.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What I claim is:

1. In a high frequency coaxial line circuit for an avalanche diode, means forming a coaxial transmission line having inner and outer conductors, means at one end of said transmission line for short circuiting said inner and outer conductors for high frequency energy, an avalanche diode connected in series with said inner conductor at the shorted end of said coaxial line, the improvement wherein, said shorting means includes a portion axially coextensive and concentric with a portion of said outer conductor to define a capacitor substantially at the shorted end of said coaxial line, and further including a metallic housing structure substantially enveloping said capacitor and shorting means, a tubular insulative member carried from said housing and disposed in coaxial alignment with the center conductor of said coaxial transmission line, and said shorting means being secured to the inner end of said tubular insulative member.

2. The apparatus of claim 1 wherein said shorting means includes an electrically and thermally conductive block disposed at the end of and substantially closing off the end of said coaxial line, and said diode having one terminal thereof affixed to said block in heat-exchanging relationship therewith, whereby said block forms a heat sink for said diode.

3. The apparatus of claim 1 including a wave-energy-reflective member disposed within said coaxial line and spaced from said shorting means to define a coaxial resonator structure to be excited by said avalanche diode, the spacing of said wave-reflective member from said shorting means being dimensioned to define the fundamental resonant frequency of said coaxial resonator at a subharmonic frequency of the operating frequency of said diode in said resonator.

4. The apparatus of claim 3, including a varactor diode connected in said coaxial resonator between said inner and outer conductors thereof for tuning the resonant frequency of said resonator.

5. The apparatus of claim 1, including a conductive lead disposed within said tubular insulative member, and a resistor connected in series with said lead and said shorting means.

6. The apparatus of claim 5 wherein said housing structure is apertured in alignment with said lead for passage of said lead into said housing through said aperture, and a radio frequency bypass capacitor disposed in said aperture in said housing for bypassing RF energy from said lead to said housing.

7. The apparatus of claim 6 wherein said resistor is disposed within said tubular insulator.

8. The apparatus of claim 1 wherein said tubular insulative member is made of a thermally conductive material for heating said avalanche diode to said housing.